United States Patent [19]

Harada

[11] Patent Number: 5,173,435
[45] Date of Patent: Dec. 22, 1992

[54] INSULATED GATE BIPOLAR TRANSISTOR

[75] Inventor: Masana Harada, Itami, Japan

[73] Assignee: Mitsubishi Denki Kabushiki Kaisha, Tokyo, Japan

[21] Appl. No.: 775,442

[22] Filed: Oct. 15, 1991

Related U.S. Application Data

[62] Division of Ser. No. 195,652, May 17, 1988, Pat. No. 5,079,602.

[30] Foreign Application Priority Data

Nov. 11, 1987 [JP]  Japan ................................ 62-285807

[51] Int. Cl.$^5$ ......................................... H01L 21/265
[52] U.S. Cl. ......................................... 437/31; 437/32; 437/33; 437/59; 257/328; 257/565
[58] Field of Search ..................... 437/31, 32, 33, 915, 437/59; 357/34, 23.4

[56] References Cited

U.S. PATENT DOCUMENTS

| | | | |
|---|---|---|---|
| 3,955,269 | 5/1976 | Magdo et al. | 437/59 |
| 4,007,474 | 2/1977 | Yagi et al. | 437/31 |
| 4,030,954 | 6/1977 | Horie | 437/31 |
| 4,435,898 | 3/1984 | Gaur et al. | 437/31 |
| 4,483,726 | 11/1984 | Issac et al. | 437/31 |
| 4,587,713 | 5/1986 | Goodman et al. | 357/23.4 |
| 4,637,125 | 1/1987 | Iwasaki et al. | 437/59 |
| 4,684,413 | 8/1987 | Goodman et al. | 437/17 |
| 4,803,532 | 2/1989 | Mihara | 357/23.4 |
| 4,821,095 | 4/1989 | Temple | 357/23.4 |
| 4,916,083 | 4/1990 | Monkowski et al. | 437/31 |
| 5,034,336 | 7/1991 | Seki | 437/31 |

Primary Examiner—Brian E. Hearn
Assistant Examiner—Kevin M. Picardat
Attorney, Agent, or Firm—Oblon, Spivak, McClelland, Maier & Neustadt

[57] ABSTRACT

An insulated gate bipolar transistor has a P-type well region (3) which is partially formed in a surface of an N$^-$-type epitaxial layer (2) formed on a P$^+$-type semiconductor substrate (1). A trench (14) is formed in a central portion of the P-type well region (3), and an N$^+$-type emitter region (4) is formed in a surface of the P-type well region (3) around the trench (14). The N$^+$-type emitter region (4) is provided thereon with an emitter electrode (7), which is extended into the trench (14) as a conductive layer to electrically connect a deep portion of the P-type well region (3) with the N$^+$-type emitter region (4). Thus, vertical resistance of the P-type well region (3) is reduced, whereby base-to-emitter resistance of an NPN transistor defined by the N$^-$-type epitaxial layer (2), the P-type well region (3) and the N$^+$-type emitter region (4) is reduced to prevent a latch-up of a parasitic PNPN thyristor. Furthermore, by means of impurity diffusion on the side wall and/or the bottom of the trench (14), the high impurity concentration region is formed in the deep portion of the P-type well region (3). Especially, lateral impurity diffusion results in reducing the resistivity of the region of the P-type well just under the N$^+$-type emitter region (4). This prevents the NPN transistor from being in conductive state. Thus, the latch-up of the parasitic PNPN thyristor is further prevented.

2 Claims, 4 Drawing Sheets

INSULATED GATE BIPOLAR TRANSISTOR

This is a division of application Ser. No. 07/195,652, filed on May 17, 1988 now U.S. Pat. No. 5,079,602.

BACKGROUND OF THE INVENTION

1. Field of the Invention

The present invention relates to an insulated gate bipolar transistor (hereinafter referred to as IGBT), and more particularly, it relates to prevention of a latch-up phenomenon of a parasitic thyristor.

2. Description of the Prior Art

In general, an IGBT device is formed by a number of parallel-connected IGBT elements (hereinafter referred to as IGBT cells), as shown in FIG. 1 of IEEE TRANSACTIONS ON ELECTRON DEVICES, VOL. ED-31, No. 6, June 1984, PP. 821–828 "The Insulated Gate Transistor: A New Three-Terminal MOS-Controlled Bipolar Power Device" by B. J. Baliga et al., for example. FIG. 1 is a sectional view showing a structure of a conventional n-channel IGBT cell, and FIG. 2 is a circuit diagram showing an equivalent circuit thereof.

Referring to FIG. 1, numeral 1 indicates a P+-type collector layer consisting of a P+-type semiconductor substrate, which is provided on one major surface thereof with an N−-type epitaxial layer 2. A P-type well region 3 is partially formed in the surface of the N−-type epitaxial layer 2 by selectively diffusing a P-type impurity, and an N+-type emitter region 4 is formed partially in the surface of the P-type well region 3 by selectively diffusing an N-type impurity of high concentration. A gate insulation film 5 is formed on the surface of the P-type well region 3 between the surfaces of the N−-type epitaxial layer 2 and the N+-type emitter region 4. This gate insulation film 5 also covers the surface of the N−-type epitaxial layer 2 to be integrated with a gate insulation film of an adjacent IGBT cell. A gate electrode 6 of polysilicon, for example, is formed on the gate insulation film 5, and an emitter electrode 7 of metal such as aluminum is formed to be electrically connected to both of the P-type well region 3 and the N+-type emitter region 4. The gate electrode 6 and the emitter electrode 7 are provided in multilayer structure through an insulation film 8, to be commonly electrically connected to each cell forming the IGBT device. A collector metal electrode 9 is formed on the back surface of the P+-type collector layer 1 in common with each of the IGBT cells.

N-channel MOS structure is provided in the vicinity of the surface of the P-type well region 3 between the N−-type epitaxial layer 2 and the N+-type emitter region 4. A positive voltage is applied to the gate electrode 6 through a gate terminal G so that electrons flow from the N+-type emitter region 4 to the N−-type epitaxial layer 2 through a channel formed in the vicinity of the surface of the P-type well region 3 under the gate electrode 6. Symbol $I_e$ indicates electron current thus carried. On the other hand, positive holes, which are minority carriers, are injected from the P+-type collector layer 1 into the N−-type epitaxial layer 2. A portion of the holes dissipate through recombination with the aforementioned electrons, while the remaining holes flow in the P-type well region 3 as hole current $I_h$. Thus, the IGBT basically operates in a bipolar manner and conductivity is increased in the N−-type epitaxial layer 2 due to a conductivity modulation effect, whereby lower ON-state voltage and larger current capacity can be implemented in contrast to a conventional power MOS.

It is to be noted that a parasitic PNPN thyristor structure is present in the IGBT cell, as is obvious from an equivalent circuit shown in FIG. 2. Such a parasitic thyristor is formed by an NPN transistor 10 defined by the N−-type epitaxial layer 2, the P-type well region 3 and the N+-type emitter region 4 and a PNP transistor 11 defined by the P+-type collector layer 1, the N−-type epitaxial layer 2 and the P-type well region 3. When both of the transistors 10 and 11 enter their respective operating states and when the sum of current gains $\alpha_1$ and $\alpha_2$ thereof becomes 1, the parasitic thyristor conducts and thereby causes a latch-up phenomenon. Since the thickness of the N−-type epitaxial layer 2 serving as the base of the PNP transistor 11 is much larger than the carrier diffusion length, the value $\alpha_2$ is relatively small. Further, there is a short circuit between the emitter and the base of the NPN transistor 10, so that the transistor barely enters the ON state. Therefore, no latch-up phenomenon is caused in the normal operating state, and the IGBT cell operates as a composite element of an n-channel MOSFET 12 and the PNP transistor 11. In this case, the base current of the PNP transistor 11 is controlled by the n-channel MOSFET 12 and, therefore, main current $I_C$ flowing from a collector terminal C of the IGBT can be controlled by a control signal applied to the gate terminal G. Assuming that $I_E$ represents current flowing in an emitter terminal E, the main current $I_C$ is $$I_C = I_E = I_e + I_h \tag{1}$$

When the main current $I_C$ of the IGBT is increased by some external cause such as noise applied to the gate terminal G, the electron current $I_e$ and the hole current $I_h$ are increased. If the hole current $I_h$ exceeds a certain value, the NPN transistor 10 conducts by a voltage drop caused by resistance $R_B$ of the P-type well region 3, and $\alpha_1 + \alpha_2 = 1$ is satisfied because of increase of the current gain $\alpha_2$ of the NPN transistor 10, so that the parasitic thyristor conducts. Thus, the IGBT enters a latch-up state. The main current $I_C$ of the IGBT cannot be controlled by the control signal applied to the gate terminal G in this state, and hence an excessive unlimited main current $I_C$ flows. In order to prevent such a latch-up phenomenon, impurity concentration of the P-type well region 3 must be increased to reduce the resistance, and the ratio of the hole current $I_h$ flowing under the N+-type emitter region 4 toward the emitter electrode 7, must be reduced.

FIG. 3 is a sectional view showing an example of IGBT cell structure generally employed for preventing the latch-up phenomenon. Such a structure is shown in IEDM 83, PP.79–82, "Improved COMFETs with Fast Switching Speed and High-Current Capability" by A. M. Goodman et al., for example. Referring to FIG. 3, a P-type well region 3 of each IGBT cell, which is square when presented in a plan view, is provided in its central portion with a P+-type region 13 which is formed by diffusing a high concentrate of P-type impurity of the same conductivity type as the region 3. Thus, resistance of the P-type well region 3 is reduced and hole current $I_h$ flowing in the central portion of the P-type well region 3 is relatively increased in ratio as compared with hole current $I_h$ flowing under an N+-type emitter region 4, so that an NPN transistor 10 is prevented from transision into a conducting state.

FIG. 4 is a diagrammatical perspective sectional view illustrating another example of IGBT cell structure generally employed for preventing the latch-up phenomenon. Such a structure is shown in IEDM 85, PP.150-153 "Experimental and Numerical Study of Non-Latch-Up Bipolar-Mode MOSFET Characteristics" by A. Nakagawa et al., for example. Referring to FIG. 4, a P-type well region 3 is formed in a stripe pattern and an N+-type emitter region 4 is formed in a partially removed pattern. Thus, parts of the P-type well region 3, from which the N+-type emitter region 4 is removed, are adapted to serve as bypasses for hole current $I_h$, so that the ratio of the hole current $I_h$ flowing under the N+-type emitter region 4 is reduced. Further, a P+-type region 13, which is similar to that shown in FIG. 3, is provided.

In order to employ the structure shown in FIG. 3, the P-type well region 3 must be deeply formed particularly in an IGBT device of high breakdown voltage, and hence the P+-type region 13 of high impurity concentration must also be formed to a deep position. Since the P+-type region 13 is formed by diffusion from the surface, concentration distribution of the impurity is inevitably lowered as the depth is increased. Therefore, resistance $R_{B1}$ in vertical direction of the P-type well region 3 cannot be sufficiently lowered in a deep portion. Further, although the P+-type region 13 is preferably formed over the entire region under the N+-type emitter region 4, the same must not reach a channel region under the gate electrode 6, in order to avoid changing the threshold voltage of the MOSFET 12. Therefore, the P+-type region 13 must be considerably separated from the channel region in view of various errors in formation, and hence the resistance $R_{B2}$, in a direction transverse to the P-type well region 3, cannot be sufficiently lowered in a portion close to the channel. Thus, the structure shown in FIG. 3 is insufficient to cope with the latch-up phenomenon.

In the structure shown in FIG. 4, on the other hand, channels are inevitably decreased because of partial removal of the N+-type emitter region 4. Such decrease of channels is disadvantageous for large current capacity. Further, since a top plan pattern of the IGBT cell shows an elongated rectangle, it is difficult to implement an IGBT device of high current capacity having a number of parallel-connected IGBT cells with a higher density cell arrangement when compared to those having square IGBT cells.

SUMMARY OF THE INVENTION

An insulated gate bipolar transistor according to the present invention comprises a first conductivity type semiconductor substrate; a second conductivity type semiconductor layer, opposite to the first conductivity type, formed on one major surface of said semiconductor substrate; a first region of the first conductivity type partially formed in the surface of said semiconductor layer; a second region of the second conductivity type partially formed in a surface of said first region; an insulation film formed on the surface of said first region and extending between the surfaces of said semiconductor layer and said second region; a control electrode formed on said insulation film; said first region having a trench formed to open at least in a part of a remaining surface part thereof; a first electrode formed on and electrically connected to said second region; a conductive layer formed in said trench to be electrically connected to said first region and said first electrode; and a second electrode formed on and electrically connected to another major surface of said semiconductor substrate.

According to the present invention, the first region has the trench, which is provided therein with the conductive layer electrically connected to the first region and the first electrode, so that vertical resistance of the first region is extremely reduced.

Accordingly, an object of the present invention is to provide an insulated gate bipolar transistor which can effectively prevent a latch-up phenomenon and which has a structure suitable for high current capacity and implementation of cell arrangement with high density.

These and other objects, features, aspects and advantages of the present invention will become more apparent from the following detailed description of the invention when taken in conjunction with the accompanying drawings.

DESCRIPTION OF THE PREFERRED EMBODIMENTS

Figure 5:
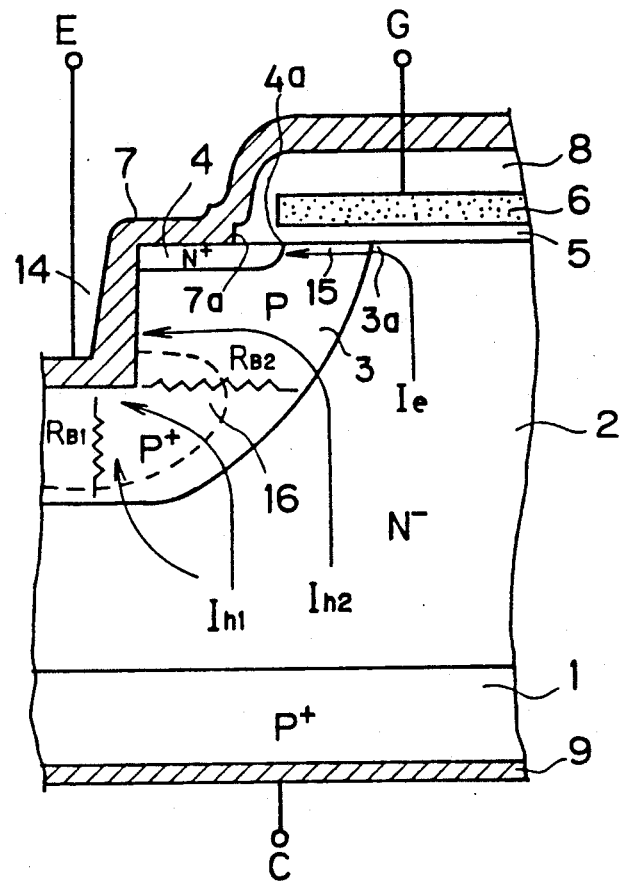
FIG. 5 is a sectional view showing cell structure of an IGBT according to an embodiment of the present invention.
Figure 7:
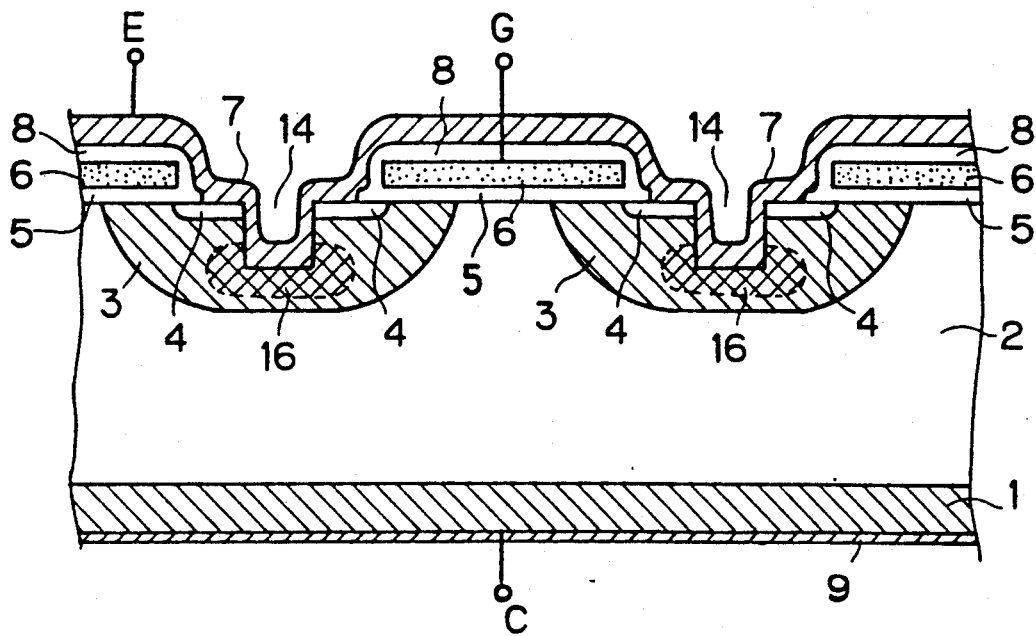
FIG. 7 is a sectional view taken along the line VII—VII in FIG. 6.
Figure 6:
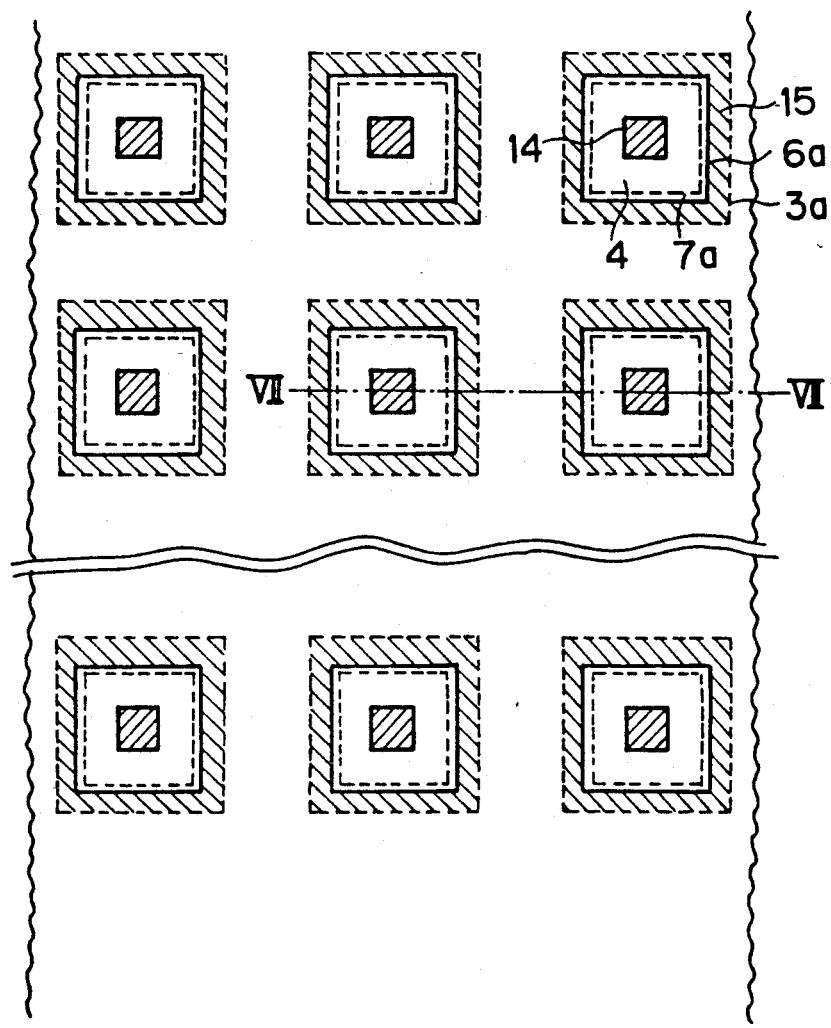
FIG. 6 is a top plan view showing an example of IGBT cell arrangement.

FIG. 5 is a sectional view showing cell structure of an IGBT according to an embodiment of the present invention, and FIG. 6 is a top plan view showing an example of arrangement of a large number of IGBT cells, which are connected in parallel to form a power IGBT device. FIG. 7 is a sectional view taken along the line VII—VII in FIG. 6.

According to this embodiment, a trench 14 is formed in a substantially central portion of each P-type well region 3. An emitter electrode 7 of metal such as aluminum is extended along an inner surface of the trench 14, to electrically connect the P-type well region 3 with an N+-type emitter region 4. A metal coated trench along a deep portion of the P-type well region 3 is thus accomplished in order to enable reduction of vertical resistance $R_{B1}$ in the central portion of the P-type well region 3.

Referring to FIGS. 5 and 6, numeral 7a indicates an outline of a contact pattern of the N+-type emitter region 4 and the emitter electrode 7. The P-type well region 3 under a gate electrode 6, i.e., a surface portion of the P-type well region 3 between an end portion 4a of the N+-type emitter 4 and an outline 3a of the P-type well region 3, serves as a channel region 15. The gate electrode 6 is formed by doped polysilicon in common with all IGBT cells. An insulation film 8 is formed on the gate electrode 6, and the emitter electrode 7 of metal such as aluminum is formed entirely over the insulation film 8. According to the arrangement shown in FIG. 6, the channel region 15 can be formed over an entire periphery of each IGBT cell. This arrangement is advantageous for high current capacity and is furthermore suitable for implementation of cells with higher density.

The P-type well region 3 is provided in a portion around a bottom surface of the trench 14 with a P+-type region 16 of low resistance, which is formed by diffusing a high concentration P-type impurity from the bottom surface. The P+-type region 16 can be formed in a desired depth in the P-type well region 3 by appropriately changing the depth of the trench 14. According to the conventional method of diffusion from the surface, becasue the P-type impurity is lower in concentration in a deep portion of the P-type well region 3, the resistance cannot be sufficiently reduced. According to this embodiment, on the other hand, diffusion is performed from the bottom surface of the trench 14, so that the P+-type region 16 of high concentration can be formed in a desired depth in the P-type well region 3, and so that the resistance in the deep portion of the P-type well region 3 can be easily lowered. Thus, it will be understood that the vertical resistance $R_{B1}$ in the central portion of the P-type well region 3 is extremely reduced, by taking account of the advantage of the metal wiring in the trench 14.

Due to such reduction in the vertical resistance $R_{B1}$, the distribution of hole current $I_h$ is such that the ratio of vertically flowing hole current $I_{h1}$ to hole current $I_{h2}$ flowing under the N+-type emitter region 4 is increased, as shown in FIG. 5. Since the potential difference developed in the interface between the P-type well region 3 and the N+-type emitter region 4 is suppressed by a reduction in the hole current $I_{h2}$ flowing under the N+-type emitter region 4, an NPN transistor defined by the N−-type epitaxial layer 2, the P-type well region 3 and the N+-type emitter region 4 has only a minimum of conduction. Therefore, the IGBT is effectively prevented from being transferred into a latch-up state.

Further, the P+-type region 16 can be laterally extended below the N+-type emitter region 4 by transverse diffusion from the bottom surface of the trench 14. Thus, transverse resistance $R_{B2}$ in the P-type well region 3 is reduced. Since voltage development by the hole current $I_{h2}$ flowing under the N+-type emitter region 4 is suppressed by such reduction in the transverse resistance $R_{B2}$, the IGBT is further prevented from the latch-up phenomenon. The P+-type region 16, being laterally diffused from the deep position of the P-type well region 3, will not reach the channel region 15 in the vicinity of the interface between the P-type well region 3 and the insulation film 5, not to influence threshold voltage of the MOSFET.

The trench 14 is preferably formed as deep as possible, in order to prevent the latch-up phenomenon. In other words, the vertical resistance $R_{B1}$ of the P-type well region 3 is reduced and the ratio of the vertical hole current $I_{h1}$ to hole current $I_{h2}$ is increased as the depth of the trench 14 is increased. However, since the breakdown voltage of the element is determined by the junction breakdown voltage of the P-type well region 3 and the N−-type epitaxial layer 2, the thickness of the P-type well region 3 between the bottom portion of the trench 14 and the N−-type epitaxial layer 2 may influence th element breakdown voltage. Therefore, these factors must be considered in determining the optimum depth of the trench 14 and the condition of diffusion of the P-type impurity from the bottom surface.

When trench 14 is formed so as to be square in section, in the central portion of each of IGBT cells which are themselves square, as shown in FIG. 6, it is possible to make a side of the IGBT cell about 20 to 40 μm in size since a side of the square section of the trench 14 can be implemented in a size of from several μm to 10 μm according to current manufacturing techniques. Such size is about ½ to ⅔ the size of a shorter side of a conventional stripe-shaped IGBT cell, and hence a more efficient cell arrangement can be implemented. Further, total channel region length in a chip is also increased to about 1.5 to 2.0 times the length of the conventional instance while retaining the same chip area and, therefore, an IGBT of high current capacity is produced.

The, procedure for manufacturing the IGBT device of the aforementioned structure will now be described. First, an N−-type epitaxial layer 2 is epitaxially grown on a P+-type semiconductor substrate 1. Then, a gate insulation film 5 of a silicon oxide film is formed over the entire surface of the N−-type epitaxial layer 2, and the gate electrode 6 of undoped polysilicon is formed over the entire surface of the gate insulation film 5. Then, patterning is performed through selective etching in order to open the region defined by the borderline 6a shown in FIG. 6, to consequently expose the N−-type epitaxial layer 2.

A P-type impurity is ion-implanted into the N−-type epitaxial layer 2 through the opening portion and is thermally diffused so that the P-type well region 3 of each IGBT cell is formed. Then, an N-type impurity is ion-implanted into the P-type well region 3 by self alignment by using the gate electrode 6 as a mask, and a heat treatment activates the impurity thus injected, so that the N+-type emitter region 4 is formed in the surface of the P-type well region 3, defined by the opening portion. At this time, the gate electrode 6 of undoped polysilicon is also doped with the N-type impurity to thereby improve the conductivity of the gate electrode 6. The insulation film 8 is formed over the entire surface, and thereafter the trench 14 is formed in the central portion of the P-type well region 3 by selective etching.

Subsequently, a P-type impurity is ion-implanted into the bottom surface of the trench 14 and is thermally diffused to form the P+-type region 16 of low resistance. During a subsequent selective ethcing step wherein a contact hole is formed, an oxide film in the trench 14 formed in the preceding thermal diffusion step and an oxide film on the N+-type emitter region 4 defined by the borderline 7a in FIG. 6 are removed, and thereafter metal deposition is performed over the entire surface to form the emitter electrode 7. Finally, a collector electrode of a metal layer is formed over the entire back surface of the P+-type semiconductor substrate 1, to obtain the structure shown in FIG. 7.

Figure 8:
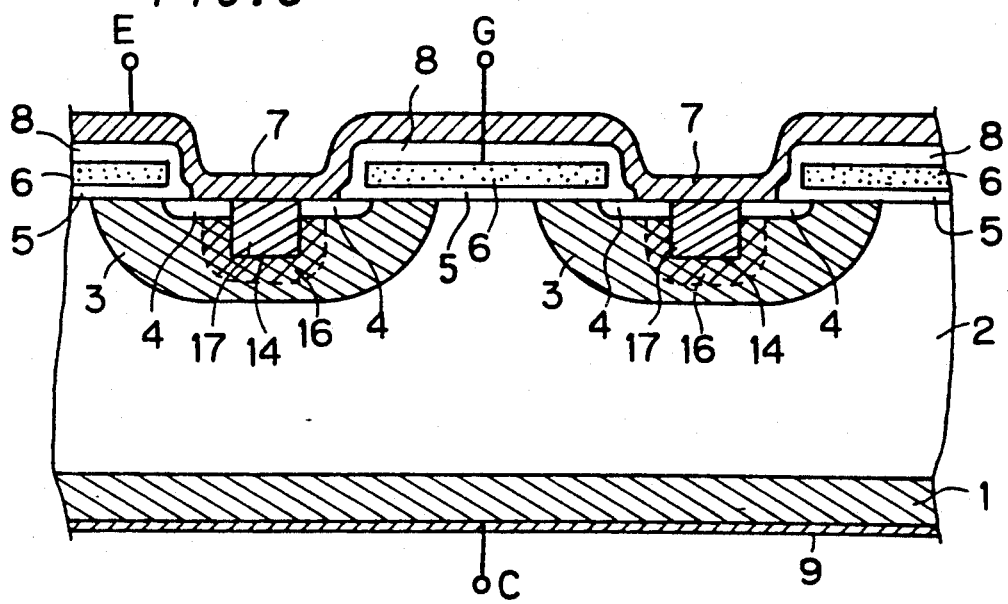
FIG. 8 is a sectional view showing cell structure of an IGBT according to another embodiment of the present invention.

FIG. 8 is a sectional view showing cell structure of an IGBT according to another embodiment of the present invention. In this embodiment, each trench 14 is filled up with doped polysilicon 17 containing a high concentration P-type impurity, to form a P+-type region 16 of low resistance in a P-type well region 3 around the trench 14 by thermal diffusion utilizing the doped polysilicon 17 as a diffusion source. Thus, the surface is flattened to facilitate formation of an emitter electrode 7. Since the P+-type region 16 and the emitter electrode 7 are electrically connected with each other by the doped polysilicon 17, an effect similar to that of the aforementioned embodiment can be attained with respect to prevention of a latch-up phenomenon.

The procedure of manufacturing the IGBT device shown in FIG. 8 is similar to that of the aforementioned embodiment up to formation of the trench 14. Then, the doped polysilicon 17 is formed over the entire surface including the trench 14, to be left only in the trench 14 by a flattening technique. Then the P+-type 16 is formed by thermal diffusion using the doped polysilicon 17 in the trench 14 as a source. A subsequent step of forming the emitter electrode 7 and a collector electrode 9 is similar to that of the aforementioned embodiment.

Figure 1:
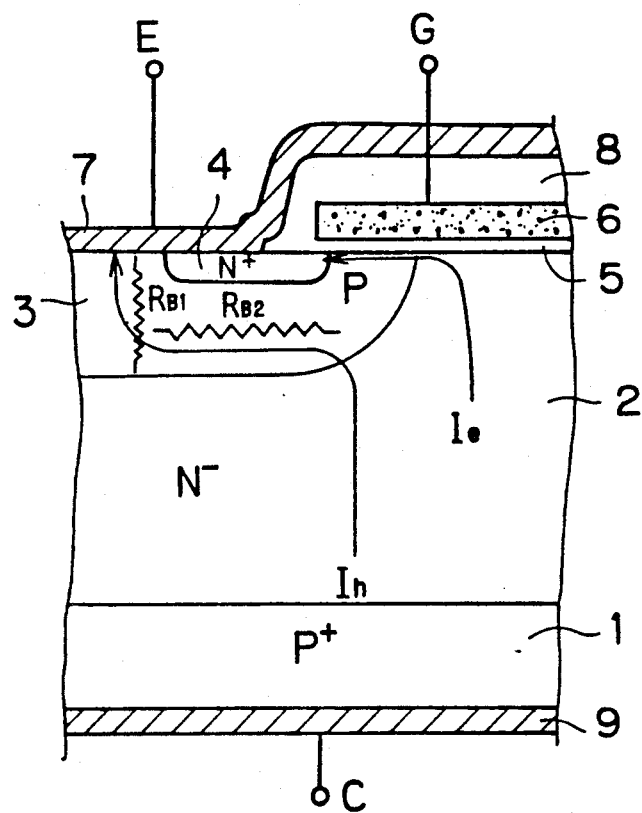
FIG. 1 is a sectional view showing conventional n-channel type IGBT cell structure.
Figure 2:
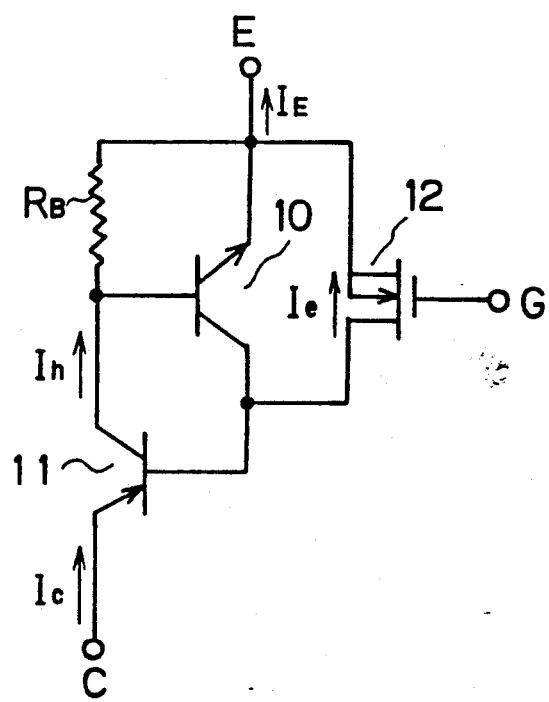
FIG. 2 is a circuit diagram showing an equivalent circuit thereof.
Figure 3:
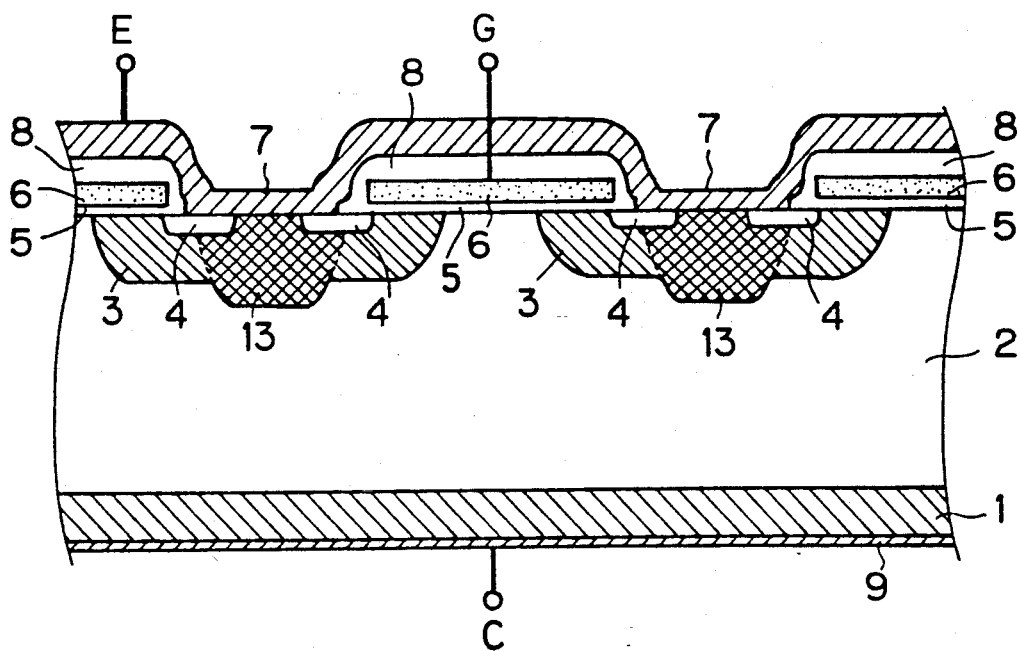
FIGS. 3 and 4 are a sectional view and a diagrammatical perspective sectional view showing examples of conventional IGBT cell structure for preventing a latch-up phenomenon respectively.
Figure 4:
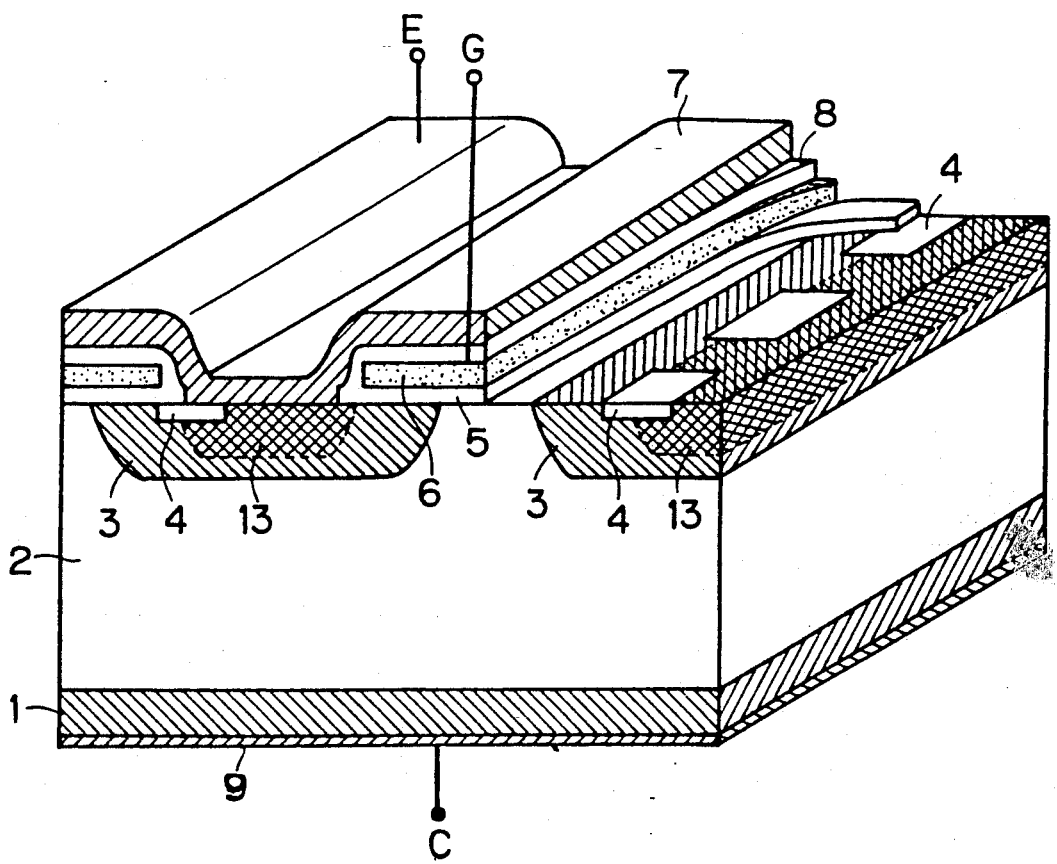

The present invention can be applied to the conventional structure shown in FIG. 3, to further improve the effect of preventing the latch-up phenomenon. In this case, the IGBT device is manufactured in sequence of formation of the P+-type region 13, formation of the P-type well region 3, formation of the N+-type emitter region 4, formation of the trench 14 and formation of the P+-type region 16.

Although the IGBT cell is square in plane pattern and n-channel type in polarity in each of the aforementioned embodiments, the present invention is also applicable to other pattern and polarity, as a matter of course.

Furthermore, although each of the aforementioned embodiments is provided with the P+-type region 16 of low resistance formed by diffusion from the trench 14, the resistance value of the P-type well region 3 in the vertical direction is considerably reduced by providing a conductive layer, such as the extended emitter electrode 7 and the doped polysilicon 17, in the trench 14 to be electrically connected to the emitter electrode 7, so that the latch-up phenomenon is effectively prevented, even if the P+-type region 16 is not provided.

According to the present invention as hereinabove described, a first region (P-type well region 3 in each embodiment) is provided with a trench and a conductive layer (extended portion of the emitter electrode 7 or doped polysilicon 17 in each embodiment) electrically connected with the first region and a first electrode (emitter electrode 7 in each embodiment) is provided in the trench, whereby vertical resistance of the first region is significantly reduced to effectively prevent a latch-up phenomenon. Further, since the trench may be simply provided in the central portion, for example, of the first region, the degree of freedom in design of the cell configuration is not restricted and an insulated gate bipolar transistor can be obtained which has a structure suitable for high current capacity and for implementation of a cell arrangement with a higher density while effectively preventing a latch-up phenomenon.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an insulated gate bipolar transistor comprising the steps of:

preparing a first conductivity type semiconductor substrate having a first and a second major surface, forming a semiconductor layer of a second conductivity type which is opposite to said first conductivity type, on said first major surface of said semiconductor substrate;

forming a first region of the first conductivity type in a surface of said semiconductor layer;

forming a second region of the second conductivity type in a surface of said first region;

forming an insulation film on the surface of said first region and extending between the surfaces of said semiconductor layer and second region;

forming a control electrode on said insulation film;

forming a trench in said first region through said second region;

filling said trench with a conductive material including the step of doping said conductive material with an impurity;

diffusing said impurity in said first region around said trench by employing said conductive material as a diffusion source to form a high concentration impurity diffusion region of the first conductivity type;

forming a first electrode on said second region and said conductive material to electrically connect said second region and said conductive material; and forming a second electrode on said second major surface of said semiconductor substrate.

2. A method of manufacturing an insulated gate bipolar transistor comprising the steps of:

preparing a first conductivity type semiconductor substrate having a first and a second major surface;

forming a semiconductor layer of a second conductivity type, being opposite to said first conductivity type, on said first major surface of said semiconductor substrate;

forming an insulation film over an entire surface of said semiconductor layer except for predetermined portions and forming a control electrode on said insulation film;

forming a plurality of first regions of the first conductivity type in a surface of said semiconductor layer in the form of an array through the predetermined portions;

forming a second region of the second conductivity type at the center of each said first region;

forming a trench in a central portion of said second region to reach said first region through said second region;

filling said trench with a conductive material including the step of doping said conductive material with an impurity;

diffusing said impurity in said first region around said trench by employing said conductive material as a diffusion source to form a high concentration impurity diffusion region of the first conductivity type;

forming an insulation film on said control electrode;

forming a first electrode over a surface of said second region around said trench and a surface of said conductive material to electrically connect said first and second regions; and forming a second electrode on said second major surface of said semiconductor substrate.

* * * * *